United States Patent [19]
Chiron et al.

[11] 3,931,572
[45] Jan. 6, 1976

[54] METHOD AND APPARATUS FOR MEASURING MAGNETIC FIELDS UTILIZING ODD HARMONICS OF AN EXCITATION SIGNAL

[75] Inventors: Guy Chiron, St. Martin D'Heres; Louis Debreuil-Monet, Valence, both of France

[73] Assignee: Commissariat a l'Energie Atomique, Paris, France

[22] Filed: Aug. 16, 1973

[21] Appl. No.: 388,901

[30] Foreign Application Priority Data
Sept. 4, 1972 France .............................. 72.31277

[52] U.S. Cl. .............................................. 324/43 R
[51] Int. Cl.[2] ......................................... G01R 33/02
[58] Field of Search ............................ 324/43 R, 47

[56] References Cited
UNITED STATES PATENTS

| | | |
|---|---|---|
| 3,239,754 | 3/1966 | Odom, Jr. et al. ................. 324/47 |
| 3,443,213 | 5/1969 | Bader et al. ...................... 324/43 R |
| 3,619,772 | 11/1971 | Ellis ................................. 324/43 R |
| 3,622,873 | 11/1971 | Stine et al. ....................... 324/43 R |
| 3,628,132 | 12/1971 | Fussell et al. .................... 324/43 R |

OTHER PUBLICATIONS
Abadeer et al., Magnetic Field Detection Using Coherent Magnetization Rotation in a Thin Film, Journ. of App. Phys., Vol. 42, No. 4. Mar. 15, 1971, pp. 1139–1140.

*Primary Examiner*—Robert J. Corcoran
*Attorney, Agent, or Firm*—William D. Stokes

[57] ABSTRACT

This invention relates to methods of measuring magnetic fields and a magnetometer for performing the method.

According to the method an alternating magnetic field is applied to a thin magnetic film along its axis of difficult magnetization.

The alternating magnetic field applied to the film has an amplitude which is less than the anisotropy field of the film, the direction of magnetization of the film then undergoing an oscillation without reversal.

An electrical signal representing variations per unit of time of the magnetic induction in the film is withdrawn and analyzed and to effect the analysis the component of the magnetic field is measured at any of the odd harmonic frequencies of the electrical signal. The electrical signal is obtained by collecting the voltage at the terminals of a conducted loop surrounding the film and having its axis directed along the easy axis of the film.

24 Claims, 8 Drawing Figures

METHOD AND APPARATUS FOR MEASURING MAGNETIC FIELDS UTILIZING ODD HARMONICS OF AN EXCITATION SIGNAL

This invention relates to a method of measuring magnetic fields and a magnetometer for performing the method.

It has already been proposed to measure a magnetic field by means of a probe consisting of a core of ferromagnetic material having a hysteresis cycle and a coil enabling the core to be subjected to an alternating periodic magnetic field of an amplitude such that it brings the core to saturation; the value of the magnetic field under measurement can be derived from the amplitude of the even harmonics of the signals collected by a second coil which is also associated with the core. This method and the magnetometers for performing it do not satisfy the conditions required for accurate measurement of magnetic fields of very small value, because they are not free from considerable background noise which masks the useful signal as soon as the latter becomes weak.

Magnetic field measuring devices have also been proposed in which the sensitive element used is a thin ferromagnetic strip having an axis of easy magnetization. Associated with this strip are: a pumping winding which delivers an alternating field oriented along the axis of easy magnetization; and a detection winding whose axis is perpendicular to the axis of easy magnetization. This system delivers an output signal on the detection winding, said signal being dependent upon the component of the field perpendicular to the axis of easy magnetization. The phenomenon used in this device is a reversal of the magnetization of the strip on each alternation of the field delivered by the pumping winding. This changeover is effected by displacement of the walls bounding the magnetic domains of the strip, and this gives rise to considerable Barkhausen noise and limits the sensitivity; in practice, this device cannot be used for measuring fields less than about ten gamma (1 gamma = $10^{-5}$ oersted).

Magnetometers have also been proposed which comprise a thin ferromagnetic film, an excitation winding whose axis is parallel to the axis of difficult magnetization, and an output winding whose axis is parallel to the axis of easy magnetization. These magnetometers make use of the existence of a plurality of domains in which magnetizations have one or other of two opposite directions. Domains adjacent to opposite directions of magnetization are separated by walls. When the field under measurement is zero, the sum of the magnetizations extending in one direction is equal to the sum of the magnetizations extending in the other direction. On each half-cycle of the excitation field the magnetizations are reversed in each of the domains. If the field under measurement is not zero, it gives preference to one of the two directions of magnetization and one of the two types of domain expands at the expense of the other. The preferential domains alternate on each half-cycle, and this produces a movement of the walls at a frequency of twice the excitation frequency. These magnetometers therefore detect a second harmonic of the excitation frequency whose amplitude is a function of the field under measurement.

These magnetometers therefore also suffer from considerable Barkhausen noise as a result of their principle of operation (reversal) of magnetization and displacement of walls twice per cycle).

More recently, a method and device have been proposed which obviate the disadvantages of the previous devices because they use a phenomenon which has a very low background noise (French Patent No. PV 769 489 of 10 October 1968 for "Method of and device for measuring low magnetic fields" - Commissariat a l'Energie Atomique). This phenomenon is the reversal of the direction of induction in a thin ferromagnetic film by coherent rotation. As compared with the reversal mechanism making use of the displacement of walls, this reversal mechanism has the advantage of having no Barkhausen noise. The magnetometer of this type uses a magnetic film of the inverted type, i.e. a film in which the critical coherent rotation curve is completely inside the critical wall displacement curve, unlike the films conventionally used. Associated with this film are a pumping winding which delivers an alternating field oriented along the axis of easy magnetization, a detection winding whose axis is parallel to the axis of easy magnetization, and a bias winding whose axis is perpendicular to the axis of easy magnetization, this winding fixing the zone of operation of the magnetic film. This device delivers to the detection winding an output signal which depends upon the component of the field parallel to the axis of easy magnetization.

This invention relates to a method of measuring magnetic fields and a magnetometer which also enable very small magnetic fields to be measured because they also obviate the formation of Barkhausen noise due to displacement of the walls; according to the invention, and unlike the above-mentioned devices, the phenomenon of reversal of the direction of magnetization is not used and instead use is made of just an oscillation of said direction between two limits. For this purpose, an alternating pumping field is used whose amplitude is insufficient for magnetization to be reversed, and this in practice is equivalent to applying a field of an amplitude less than the anisotropy field of the film. This excitation field is applied along the axis perpendicular to the axis of easy magnetization. Since the magnetization does not undergo two reversals on each cycle, it is no longer necessary to analyse the second harmonic of the detected signal as in the prior art magnetometers. It is possible advantageously to analyse the odd harmonics, for example, as will be indicated hereinafter.

Although in its above form the magnetometer according to the invention is subject to only very low Barkhausen noise and such noise is in any case much less than that of the prior art magnetometers operating on the second harmonic, said noise can be reduced still further by using a thin ferromagnetic film which is monodomain, so that said film has no walls. This monodomain film may advantageously be in the form of a cylindrical film, the axis of difficult magnetization of which is parallel to the axis of the supporting cylinder and the axis of easy magnetization is circumferential, hence closed on itself. In such a film, the change of direction of the magnetization is effected without displacement of any walls, and hence without Barkhausen noise.

In addition to the advantages concerning the reduction or even the absence of Barkhausen noise, the magnetometer according to the invention also has the advantage of giving an analysis electrical signal substantially proportional to the component of the field under analysis, such component being, as will be shown hereinafter, the component parallel to the axis of difficult magnetization and not, as in the prior art magnetometers, the component parallel to the easy axis.

More specifically, the invention relates to a method of measuring the component of a magnetic field, in which there is applied to a thin ferromagnetic film having an axis of easy magnetization, an axis of difficult magnetization, and a field of anisotropy, an alternating magnetic field of frequency F in the direction of difficult magnetization, and in which there is withdrawn an electrical signal representing the variations per unit of time of the magnetic induction in the said film, and the said electrical signal is analyzed, characterized in that an alternating magnetic field is applied whose amplitude is less than the said anisotropy field, the direction of magnetization of the film then undergoing an oscillation without reversal and in that to effect the said analysis the component is measured at either of the frequencies F and 3F of the said electrical signal whose amplitude is representative of the component of the field under measurement along the axis of difficult magnetization.

According to a second variant, the method according to the invention is also characterized in that an alternating magnetic field is applied whose amplitude is less than the said anisotropy field, the direction of magnetization of the film then undergoing an oscillation without reversal and in that a cylindrical thin ferromagnetic film is used having a circumferential easy axis and in that the said electrical signal is taken by collecting the voltage at the terminals of at least one conductive loop surrounding the said film and having its axis directed along the easy axis.

Preferably, use is made of:
a monodomain this ferromagnetic film
a thin ferromagnetic film saturated by any suitable means, more particularly by the application — in an initial stage of the method — of a magnetic field along the axis of easy magnetization. To collect the said electrical signal, the useful signal is taken from the terminals of at least one conductive loop surrounding the said ferromagnetic film and having its axis coinciding with its axis of easy magnetization.

The invention also relates to a magnetometer for performing the above-described method and of the type comprising a thin ferromagnetic film having an axis of easy magnetization, an axis of difficult magnetization, and a specific anisotropy field value, an excitation winding whose axis is parallel to the direction of difficult magnetization and fed by an alternating current at the frequency F by means of a current generator, means for withdrawing an electrical signal representing the variations per unit of time of the magnetic induction in the said film and electronic means for analyzing the said electrical signal, characterized in that the alternating current passing through the said excitation winding has a smaller amplitude than the amplitude which would be produced by a magnetic field of an amplitude equal to the said anisotropy field and in that the means for analyzing the electrical signal comprise: a first selective amplifier tuned to a frequency $f$ and receiving the said electrical signal; a synchronous detector connected to the said amplifier and giving the amplitude of the amplified voltage at the frequency $f$, it being possible for said frequency $f$ to assume either of the values F of 3F; means for reading the said amplitude which represents the component of the magnetic field under measurement along the axis of difficult magnetization.

According to a second embodiment, the magnetometer according to the invention is also characterized in that the alternating current passing through the said excitation winding has an amplitude less than the amplitude which would be produced by a magnetic field of an amplitude equal to the anisotropy field, and in that the said film is cylindrical with a circumferential easy axis and in that the said means for withdrawing the electrical signal are formed by at least one conductive loop surrounding the said film and having its axis directed along the easy axis.

Other features and advantages of the invention will be more readily apparent from the following description of exemplified embodiments given by way of explanation without any limiting force with reference to the accompanying drawings wherein:

FIG. 7a shows a probe assembly and 7b is a cross section therethrough.

Figure 1:
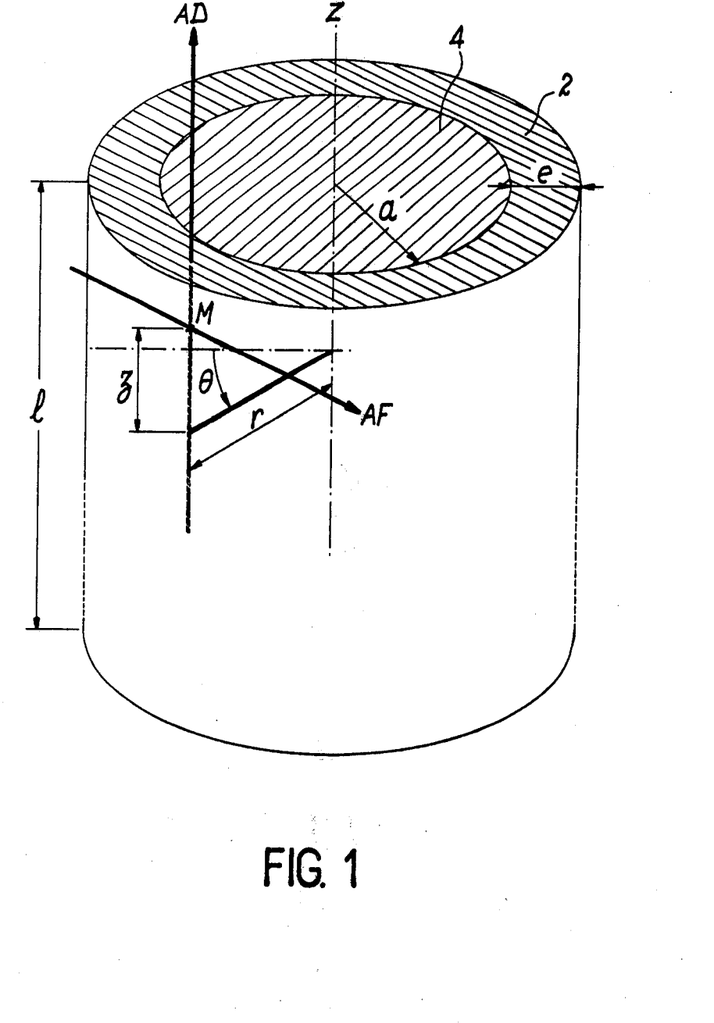
FIG. 1 shows a cylindrical monodomain thin magnetic film on its support and defines the axes of magnetization, the co-ordinates used and the dimensions.

Referring to FIG. 1, a thin monodomain magnetic film 2 is shown on a cylindrical support 4; the magnetic anisotropy of this thin film is characterized by its axis of easy magnetization, hereinafter referred to as the "easy axis", by its axis of difficult magnetization ("difficult axis") and by the value of the anisotropy field $H_K$. The difficult axis is parallel to the axis Z of the support cylinder, and the easy axis is circumferential; it is therefore closed on itself and hence there is only a single domain in the film. As indicated above, the absence of any wall means that any changes of direction in magnetization are effected without any displacement noise.

The other characteristics of the film are as follows: its saturation magnetization $\vec{I}_S$, the thickness $e$ of the film, the radius $a$ of the support, the length $l$ of the film. The system of co-ordinates best suited to this geometry is of course the conventional cylindrical co-ordinates system $r$, $\theta$ and $z$, which are defined in FIG. 1. The easy axis is denoted by AF and the difficult axis by AD.

According to a variant of the method of the invention, the monodomain thin film can be saturated along its easy axis by temporarily applying a magnetic field $\vec{H}_{Fl}$ greater than the anisotropy field $H_K$ and in the direction of the easy axis, i.e., by applying a field whose lines of force are circular. This field may be created by a current flowing parallel to the axis Z, for example in the support 4 if the latter is conductive.

The magnetization intensity vector then extends along the easy axis with the value of the saturation magnetization intensity $I_S$ as the module. When the saturation field $\vec{H}_{Fl}$ is eliminated, the vector $\vec{I}_S$ assumes a position which depends on the field $\vec{H}_D$ along the difficult axis and on the field $\vec{H}_F$ along the easy axis.

To simplify calculations, we shall consider only the component along the easy axis. The field $\vec{H}$ applied to the probe is therefore equal to the projection on to the difficult axis, i.e. $\vec{H}_D$. The magnetic induction $\vec{B}$ in the volume of the thin layer is then given by:

$$\vec{B} = \mu (\vec{I}_s + \vec{H}_D).$$

If the field $\vec{H}_D$ varies, $\vec{I}_s$ and $\vec{B}$ vary also. The variations in the induction B induce a voltage in a loop enlacing the film and with its axis parallel to its easy axis, said voltage being given by the following equation:

$$V = -\frac{d\phi}{dt} = \mu o e l \frac{dI_{s\theta}}{dt}$$

According to the invention, the component $H_D$ on the difficult axis is considered as the sum of the two fields: the component $h$ along the difficult axis of the field to be measured and the field $h_o \cos \omega t$, created artificially at the probe.

$$H_D = h + h_o \cos \omega t \text{ with } \omega = 2\pi F$$

In order to prevent the application of sinusoidal field from causing reversal of the magnetization, $h_o$ is made less than $H_K$. The magnetization therefore oscillates between two directions forming angles $+\alpha'$ and $-\alpha''$ with respect to the easy axis.

Figure 2:
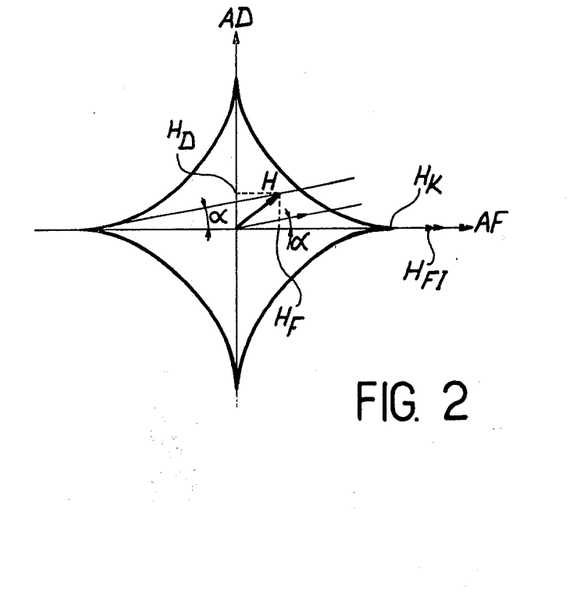
FIG. 2 is the Stoner-Wohlfarth astroid, which is the critical curve giving the intensity of the applied magnetic field for various orientations with respect to the axis of easy magnetization, from which there is only one possible stable state for magnetization.

The field along the difficult axis therefore varies in rhythm with the auxiliary alternating field and hence causes the magnetization component $I_{s\theta}$ to vary. FIG. 2 enables this variation of the projection of the magnetization intensity on to the easy axis to be calculated. This figure shows the Stoner-Wohlfarth astroid which is well known in the study of thin film ferromagnetism; this curve is plotted in a system of axes in which the abscissae correspond to the easy axis AF and the ordinates correspond to the difficult axis AD; this astroid is the critical curve giving the intensity of the applied magnetic field for various orientations with respect to the easy axis, from which there is only one possible stable state for magnetization in the film. According to a known geometric construction it enables the orientation of the magnetization to be determined from a field H applied to the film. For this purpose all that is required is to plot the tangent to the astroid from the end of the vector H, and this enables an angle $\alpha$ to be determined with respect to the easy axis, said angle being the angle assumed by the magnetization with respect to the easy axis. The apices of this astroid define the anisotropy field, which is designated by $H_K$; $H_{FI}$ denotes the saturation field applied momentarily to the layer in order initially to saturate the magnetization in the direction of the easy axis. The construction of FIG. 2 therefore enables the angle $\alpha$ between the magnetization intensity and the easy axis to be calculated; we find:

$$tg\ \alpha = (H_D/H_K) [1 - (H_D/H_K)^2]^{1/2}$$

This expression enables the two end orientations $+\alpha'$ and $-\alpha''$ between which the magnetization oscillates to be calculated. With this expression it is also possible to calculate the time derivative of the projection of the magnetization intensity on to the easy axis and hence the voltage at the ends of the means for withdrawing the electrical signal representing the variation per unit of time of the magnetic induction in the magnetic film. Assuming that the square of the amplitude of the magnetic field along the difficult axis ($H^2_D$) is very much less than the square of the amplitude of the anisotropy field ($H^2_K$), we find that the voltage V is composed of signals at the frequency F, 2F, 3F and 4F. In particular, the signal $V_{3F}$ $$V_{3F} = \mu \frac{I_s}{H_K} \cdot e \cdot l \cdot \omega \frac{h_o}{H_K} \left[ \frac{3}{8} \frac{h_o}{H_K}{}^2 \right] h$$

and the amplitude of the second harmonic is given by the following:

$$V_{2F} = \mu \frac{I_s}{H_K} \cdot e \cdot l \cdot \omega \frac{h_o}{H_K}{}^2 \left[ \frac{1}{2} + \frac{1}{8} \frac{h_o}{H_K}{}^2 + \frac{3}{4} \frac{h}{H_K}{}^2 \right]$$

If, in addition, we assume that the square of the amplitude of the field under measurement, $h^2$, remains very small with respect to the square of the amplitude of the anisotropy field $H^2_K$, the signal $V_F$ at the fundamental frequency F is also expressed by a linear equation in respect of $h$:

$$V_F = \mu \frac{I_s}{H_K} \cdot e \cdot l \cdot \omega \frac{h_o}{H_K} \left[ 1 + \frac{3}{8} \frac{h_o}{H_K}{}^2 \right] h$$

If we allow for the component $H_F$ along the difficult axis, the calculations are more complex but the result is substantially the same so that such calculations add nothing to an understanding of the invention as compared with the above simplified calculations.

If the field under measurement is zero, the magnetization oscillates symmetrically about the easy axis and $\alpha' = \alpha''$. Due to symmetry, there are no odd harmonics. This is indicated by the above formulae if we take $h = 0$. The existence of a component along the difficult axis destroys the symmetry and results in the odd harmonics whose amplitude is proportional to the component under measurement.

It will therefore be apparent that the magnetometer according to the invention differs fundamentally from the above-described prior art magnetometers, both in its principle and in its performance. With regard to principle, the excitation field does not produce any reversal of the magnetization, but an ocsillation which does not give the second harmonic any preferential part, but which does give preferential treatment to the odd harmonics: and in respect of performance the magnetometer according to the invention differs due to the absence of any displacement of the walls.

Figure 3:
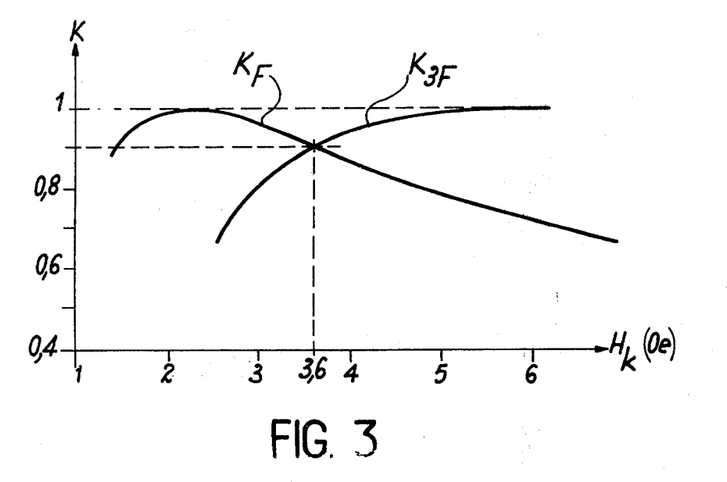
FIG. 3 illustrates the standardized sensitivity curves of a magnetometer using either the first harmonic or the third harmonic.

The above formulae show that the sensitivity of the measurement depends firstly on the excitation through the agency of the amplitude $h_o$ and secondly on the value of the anisotropy field $H_K$. It is apparent that it is advantageous to make $h_o$ as large as possible to increase the value of the electric signal. However, the critical astroid curve, the equation of which is:

$$\frac{H_D}{H_K}{}^{2/3} + \frac{H_F}{H_K}{}^{2/3} = 1$$

shows that the value of $h_o$ must be necessarily limited; if we consider that $H_F$ cannot exceed the maximum value of the terrestrial field, which is 0.7 Oe, the limiting value for $h_o$ is given by the following:
$$h_o{}^{2/3} \leqslant HK^{2/3} - (0.7)^{2/3}$$
Also, the ratio $h_o/H_K$ must be made as large as possible by making $H_K$ as small as possible, and this reduces the top limit of $h_o$. These two opposite conflicting requirements mean that the sensitivity $K = V/h$ passes through a maximum when $H_K$ varies. This is shown in FIG. 3, which illustrates the standardized sensitivity curves with respect to the maximum sensitivity, for a magnetometer using either the first harmonic (curve $K_F$) or the third harmonic (curve $K_{3F}$). These curves show that for the specific value $H_K = 3.6$ Oe, 90% of the maximum value of the sensitivities $K_F$ and $K_{3F}$ are obtained in both cases. These sensitivities are also different since their ratio is given by the following:

$$\frac{K_{3F}}{K_F} = \frac{\frac{3}{8}\left(\frac{h_o}{H_K}\right)^2}{1 + \frac{3}{8}\left(\frac{h_o}{H_K}\right)^2}$$

Since $h_o/H_K$ is smaller than 1, there is less sensitivity taking the third harmonic than the fundamental. In particular, when $H_K = 3.6$ Oe, the ratio of the sensitivities is: 0.1; however, the use of the third harmonic enables the excitation frequency (F) and the frequency of the detected signal (3F) to be separated distinctly.

When the values $H_K$ and $h_o$ have been selected, the theoretical sensitivity of the magnetometer then depends only on the excitation frequency F, the dimensions of the probe ($a$ and $l$) and the magnetization intensity of the material $I_S$.

Figure 4:
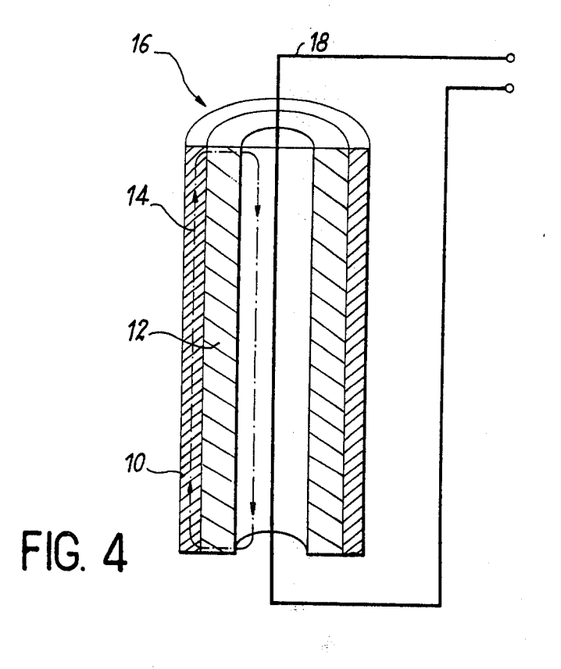
FIG. 4 is a diagram showing the principle of the useful signal output system.

Referring to FIG. 4, we shall now describe the principle of the preferred useful signal sampling device. The support 12 used is an insulating hollow tube inside which extends a conductive lead 18. This lead forms a loop surrounding the magnetic film 10 and the useful signal V is collected from its terminals. This configuration is particularly advantageous when there are several turns of conductive lead 18 around the film 10. The useful signal is in fact than multiplied by the number of turns, so that the signal-noise ratio can be increased. In fact, the noise due to the magnetic film, which is greatly reduced as compared with prior art systems because of the different type of operation and because, where necessary, a monodomain configuration is used, is undoubtedly multiplied by the same factor but the noise of the following electronic circuits remains constant.

Figure 5:
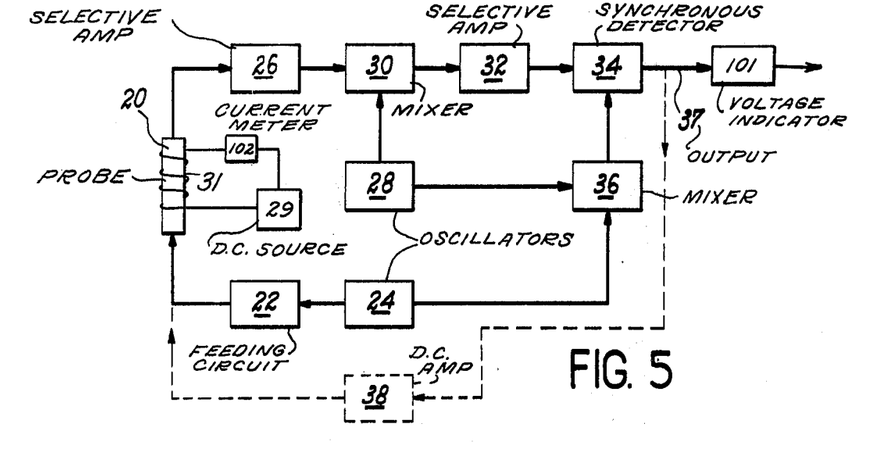
FIG. 5 is a synoptic diagram of the analysis means in the case in which the fundamental is used.

The construction of the actual probe having been specified more particularly with reference to FIGS. 1 and 4, we shall now examine in greater detail the means of analyzing the voltage V collected. These means are shown in FIG. 5, which is a synoptic diagram of an analysis circuit used, for example, in a case in which the fundamental frequency is used. Referring to this figure, the excitation winding for the probe 20 is fed by circuit 22 connected to a first oscillator 24 of frequency F. The voltage at the ends of the magnetic film is collected and amplified by a selective amplifier 26 tuned to the frequency F; a second oscillator 28 of frequency F' ≠ F feeds the mixer 30, which delivers at its output an intermediate signal at frequency |F − F'|; the selective amplifier 32 tuned to the frequency |F − F'|, amplifies this intermediate signal and is connected to a synchronous detector 34 which also receives a reference signal of frequency |F − F'| generated in a second mixer 36 which is fed by the two oscillators 24 and 28. An indicator instrument 101 may be connected to the output 37 to show the value of the d.c. voltage which appears there and which is proportional to the value of the component of the magnetic field under measurement along the difficult axis of the probe.

In an alternative embodiment corresponding to the circuit shown in broken lines in FIG. 5, the d.c. voltage appearing at the connection 37 is taken and amplified in a d.c. amplifier 38 and re-injected into the excitation winding of the probe 20 with a sign such that the magnetic field is compensated. This gives an output voltage control.

If it is desired to improve the protection against the excitation signal at the frequency F and to draw from the terminals of the probe only the signals which are related to the existence of a magnetic field $h$, it is advantageous to use two thin magnetic films, the difficult axes of which are parallel, and which are fed by one excitation coil and are surrounded by two useful signal output windings which are connected in opposition, or a thin magnetic film fed by two excitation coils connected in opposition and surrounded by one suitably disposed useful signal output winding; the voltages induced at the frequency F due to the excitation then compensate for one another, but the voltages induced in the thin films and related to the presence of the magnetic field under measurement are added together.

According to a second embodiment of the magnetometer according to the invention, the third harmonic of the signal detected at the terminals of the probe is analyzed. The analysis circuit is obtained from that shown in FIG. 5 by replacing the amplifier 26 by a selective amplifier tuned to the frequency 3F. This variant results in lower sensitivity as shown above, but does away with the signals at the frequency F which may be induced in the analysis device by the excitation signals.

As already indicated in connection with FIG. 3, if it is required to analyze both the fundamental and the third harmonic, all that is required is the provision of two corresponding analysis networks, and it is advantageous to make the anisotropy field $H_K$ in the region of the value 3.6 Oe, at which the two sensitivities $K_F$ and $K_{3F}$ are equal to 90% of their maximum values.

Figure 6:
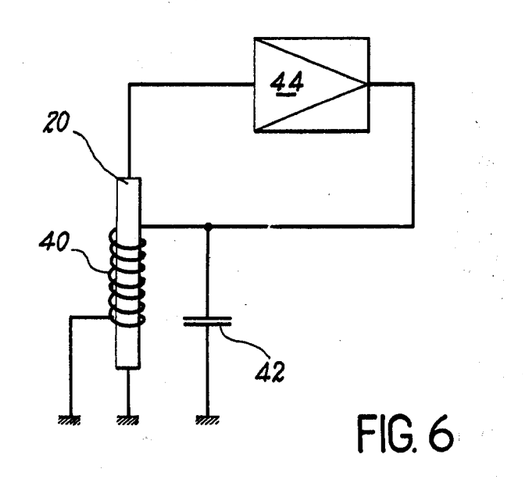
FIG. 6 diagrammatically illustrates a magnetometer connected as an oscillator.

According to a different embodiment, the output voltage V is amplified and is used for magnetization of the excitation winding, which forms part of an oscillatory circuit so that the system forms an oscillator. This is shown in FIG. 6, which the probe 20 is excited by the winding 40 connected in parallel with the capacitor 42 and fed by the voltage generated in the thin magnetic film and amplified by the amplifier 44. In this oscillatory circuit, the value of the magnetic field $h$ is derived from the amplitude of the oscillations.

The functioning of the apparatus of FIG. 6 is the following. It consists of a device self-oscillating consisting of an oscillating circuit constituted by coil 40 and a condenser 42. If there exists an electrical oscillation in such a circuit the magnetic field produced by the coil 40 generates an oscillation in the direction of magnetization in the probe 20. This probe is equipped with means for taking off an electrical signal not shown in detail but which can be identical to lead 18 in FIG. 4. The electrical signal taken off by these means is amplified by circuit 44 and reinjected in the oscillating circuit. Such a circuit is self-oscillating, which signifies that it becomes the base of an oscillation whose amplitude is such that the losses in the circuit are exactly compensated by the gain of the amplifier 44. It is thus not necessary to excite the ferromagnetic layer by an exterior apparatus since the layer is a part of the oscillating circuit.

One can grossly compare this circuit with an oscillating circuit which would include, in addition to an inductance and a capacitance, a transformer, the inductance being wound around the primary and the supply voltage of this inductance being taken off the taps of the secondary and amplified. This is only an analogy intended to make better understood the structure of the apparatus. The frequency of oscillation of such a circuit is determined by the values in the inductance 40 and capacitance 42 as in a classic LC circuit. This frequency of oscillation is not the interesting characteristic of the circuit since we are interested primarily in the amplitude of the oscillation, this amplitude being a function of the component of the magnetic field to be measured along the axis of difficult magnetization.

If the approximation $h^2 << H^2_{K'}$ — which entails proportionality of the voltage at the fundamental frequency $V_F$ and the amplitude of the magnetic field to be measured $h$ — is not satisfied for some magnetic fields under measurement, it may be advantageous to satisfy it by the use of a compensatory winding whose axis is parallel to the difficult axis and carries a d.c. producing a magnetic field opposed to the field under measurement, in which case the probe indicates the difference between the magnetic field under measurement and the compensatory field, which is assumed to be known. The compensation of the field under measurement may be complete, in which case the direct current is adjusted manually so that, for example, output voltage V measured by the indicator instrument 101 is zero; in this zero method, the value of the magnetic field is derived from the current flowing in the compensatory winding and measured by the current meter 102.

Figures 7A, 7B:
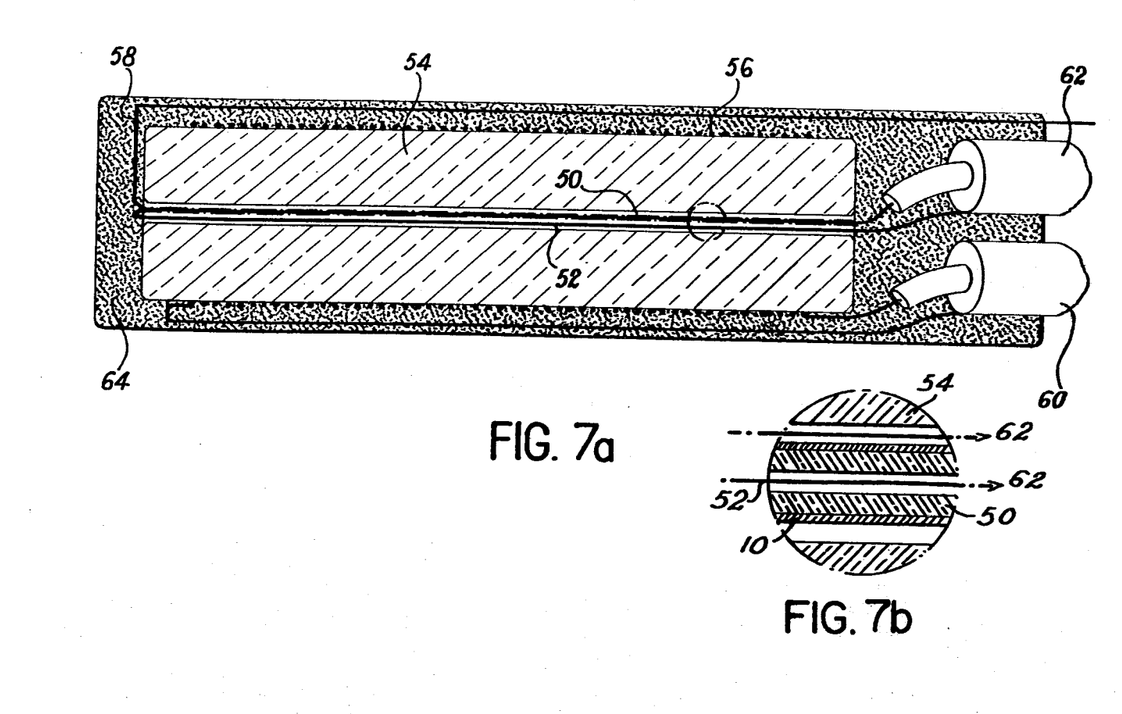

By way of explanation, FIG. 7 shows a specific probe assembly; the wire 50 supporting the thin film 10 and the measuring winding 52 are introduced into an insulating tube 54, for example of glass, on which the excitation winding 56 is wound; the wire 58 is used for initial saturation; (it could be dispensed with and the measuring winding 52 could be used for this purpose); the supply to the winding 56 is made via the coaxial conductor 60; the signal taken from the ends of the probe is carried by the coaxial cable 62. The system may, if required, be moulded in a material 64 which improves the mechanical stability of the probe. The wire 50 is itself an insulating hollow tube, for example of quartz, inside which passes the measuring winding 52. Although only one wire has been shown, said winding advantageously comprises a plurality of turns as was indicated above and has the general shape of a torus wound around the support 50 bearing the film 10. Applicant has made a probe of this kind, the sensitivity of which was about 70 nanovolts/gamma and the noise was of the order of 2 nanovolts/gamma, corresponding to 3 centigamma.

The above description relates to a system comprising thin ferromagnetic films on a cylindrical support, because this arrangement enables a monodomain film configuration to be obtained most easily to minimize noise. The invention is, of course, more general and covers a system comprising non-cylindrical films, e.g. plane, provided that the arrangements of the axes of the excitation winding, of the field under measurement and of the useful signal output circuit in relation to the easy axis of the film are observed.

We claim:
1. A method of measuring the component of a magnetic field comprising the steps of:
   applying as an excitation to a thin ferromagnetic film having an axis of easy magnetization, an axis of difficult magnetization, and a field of anisotropy, a first electrical signal for producing an alternating magnetic field of frequency F in the direction of difficult magnetization said alternating field having an amplitude less than the said anistropy field so that the direction of magnetization of the said film undergoes an oscillation without reversal;
   detecting from the easy axis of said film for analysis a second electrical signal representing the variation in the magnetic induction B within the said film, said signal containing analyzable odd harmonics of the excitation frequency F, said harmonics existing only in the presence of said component under measurement; and
   analyzing any of the odd harmonic frequencies of the said electrical signal whose amplitude is representative of the component of the field under measurement along the axis of difficult magnetization.

2. A method according to claim 1, characterized in that the said thin film is monodomain.

3. A method according to claim 1, characterized in that the said film is initially saturated by the application of a magnetic field along the axis of easy magnetization.

4. A method according to claim 1 characterized in that the said second electrical signal is collected from the terminals of at least one conductive loop surrounding the said film and having its axis coinciding with the axis of easy magnetization of said film.

5. The method of claim 1 wherein the magnetic film is cylindrical, having a circumferential easy axis and wherein the said second electrical signal is taken by collecting the voltage at the terminals of at least one conductive loop surrounding the said film and having its axis directed along the easy axis.

6. The method of claim 5 wherein the said cylindrical film is also monodomain.

7. A method according to claim 1, characterized in that a known magnetic field is applied along the axis of difficult magnetization to reduce the field under measurement.

8. A method according to claim 7, wherein said magnetic field applied along the axis of difficult magnetization cancels the field under measurement, said second electrical signal becoming zero.

9. A magnetometer comprising:
   a thin ferromagnetic film having an axis of easy magnetization and axis of difficult magnetization and a specific anistropy field value;
   a single excitation winding with an axis parallel to the direction of difficult magnetization;
   current generator means for feeding said winding with a first electrical signal comprising an alternating current having only the single frequency F, and having an amplitude less than that which would produce a magnetic field of amplitude equal to the said anisotropy field for varying the magnetic induction $\overline{B}$ in said film at frequencies which are harmonics of F;

means for detecting from the easy axis of said film a second electrical signal representative of said variation in said magnetic induction $\overline{B}$ within the said film and containing analyzable odd harmonics of F, said harmonics existing only in the presence of an external field component under measurement;

means for analyzing said second electrical signal including a first selective amplifier tuned to the frequency F and receiving said electrical signal, and a synchronous detector connected to the output of said amplifier and set for detecting the amplitude of the amplified voltage of said electrical signal at the frequency F; and means for reading said amplitude, which represents the magnitude of the field under measurement along the difficult axis.

10. The magnetometer of claim 9 wherein said thin film is cylindrical with a circumferential easy axis.

11. The magnetometer of claim 9 wherein said means for detecting the second electrical signal comprises at least one conductive loop surrounding the said film and having its axis directed along the said easy axis.

12. The magnetometer of claim 11 wherein the said film is deposited on an insulating wire.

13. The magnetometer of claim 9 wherein said film is deposited on a hollow support and output wherein said means for detecting the second electrical signal comprises a conductive loop passing inside the said support.

14. The magnetometer of claim 9 further including means for saturating the film along its easy axis.

15. The magnetometer of claim 14 wherein the said film is deposited on a hollow support and said saturating means includes a conductor wire passing inside the said support.

16. The magnetometer of claim 9 characterized in that the said analysis means also comprise the following after the first selective amplifier: an oscillator of frequency $f' \neq F$; a first mixer which receives the output signal from the said first selective amplifier and the output signal from the said second oscillator; a second selective amplifier tuned to the frequency $F - f'$ and connected to the output of the said first mixer, a second mixer which receives the output signal from the first oscillator at frequency F and the output signal from the second oscillator at frequency $f'$ and which delivers a reference signal at the frequency $F - f'$, and in that the synchronous detector receives the output signal of the second selective amplifier at the frequency $F - f'$ and the reference signal of the said second mixer and delivers a d.c. signal proportional to the component of the field under measurement.

17. The magnetometer of claim 9 further including: feedback circuit means including a d.c. amplifier for amplifying the signal detected by said detector to produce a d.c. signal proportional to said detected signal and feeding said amplified detected signal back into said excitation winding.

18. The magnetometer of claim 9 further including a compensation winding having its axis parallel to the axis of difficult magnetization and fed by a controllable d.c. generator.

19. The magnetometer of claim 18 further including a zero detector instrument connected to the terminals of the electrical signal output means and an indicating instrument for the current passing through the said compensation winding.

20. The magnetometer of claim 9 wherein said analyzing means further includes a second amplifier tuned to a frequency of 3F for amplifying said second electrical signal and a second synchronous detector connected to the output of said amplifier and set for detecting the amplitude of the signal at the said output of said amplifier at the frequency 3F, and wherein said anisotropy field is set at about 3.6 Oe.

21. A magnetometer comprising:
a thin ferromagnetic film having an axis of easy magnetization an axis of difficult magnetization and a specific anisotropy field value;

a single excitation winding with an axis parallel to the direction of difficult magnetization;

current generator means for feeding said winding with an alternating current having only the single frequency F, and having an amplitude less than that which would produce a magnetic field of amplitude equal to the said anisotropy field for varying the magnetic induction in said film at frequencies which are harmonics of F, means for withdrawing from said film an electrical signal representative of said variation in said magnetic induction;

means for analyzing said electrical signal including a first selective amplifier tuned to the frequency 3F and receiving said electrical signal, and synchronous detector connected to the output of said amplifier and set for detecting the amplitude of the amplified voltage of said electrical signal at the frequency 3F; and means for reading said amplitude.

22. A method of measuring the component of a magnetic field using an oscillatory circuit comprising a winding and a capacitance, comprising the steps of:
inserting in said winding a thin ferromagnetic film having an axis of easy magnetization, an axis of difficult magnetization, and a field of anisotropy, withdrawing from the easy axis of said film an electrical signal representing the variations per unit of time of the magnetic induction in said film, amplifying said electrical signal, feeding said winding by said amplified electrical signal, said signal generating a magnetic field whose amplitude is less than the said anisotropy field, the direction of magnetization of the film then undergoing an oscillation without reversal;

and measuring the amplitude of the electrical oscillation generated in said oscillatory circuit by said feeding of said winding.

23. A magnetometer for measuring the component of a magnetic field, comprising:
an oscillatory circuit with a winding and a capacitance, a thin ferromagnetic film having an axis of easy magnetization, an axis of difficult magnetization, and a field of anisotropy, said film being inserted in said winding, means for withdrawing from said film an electrical signal representing the variations per unit of time of the magnetic induction in said film, means for amplifying said electrical signal, means for feeding said winding with said amplified electrical signal to produce an electrical oscillation in said oscillatory circuit and to generate, a magnetic field whose amplitude is less than the said anisotropy field, the direction of magnetization of the film then undergoing an oscillation without reversal, means for measuring the amplitude of said electrical oscillation.

24. A method of measuring the component of a magnetic field comprising the steps of:

applying to a thin ferromagnetic film having an axis of easy magnetization, an axis of difficult magnetization, a field of anisotropy, a single alternating magnetic excitation field of frequency F in the direction of difficult magnetization, said alternating field having an amplitude less than the said anisotropy field of said film so that the direction of magnetization undergoes an oscillation without reversal;

withdrawing from the easy axis of said film a single, unmodulated electrical signal containing only harmonics of F and representing the variations per unit of time of the magnetic induction in the said film; and analyzing any of the odd harmonic frequencies of the said electrical signal whose amplitude is representative of the component of the field under measurement along the axis of difficult magnetization.

* * * * *